United States Patent

Weng et al.

[11] Patent Number: 5,879,577
[45] Date of Patent: Mar. 9, 1999

[54] PROCESS FOR WAFER PERIPHERAL EDGE DEFECT REDUCTION

[75] Inventors: Kuo-Yao Weng, Taoyuan Hsien; Yeh-Jye Wann, Hsin-Chu, both of Taiwan

[73] Assignee: Taiwan Semiconductor Manufacturing Company Ltd., Hsin-Chu, Taiwan

[21] Appl. No.: 782,710

[22] Filed: Jan. 13, 1997

[30] Foreign Application Priority Data

Dec. 13, 1996 [TW] Taiwan ................... 85115451

[51] Int. Cl.⁶ .................................. H01L 21/302
[52] U.S. Cl. .................... 216/92; 216/49; 216/95; 216/97; 438/748
[58] Field of Search ................... 216/49, 92, 95, 216/97; 438/748, 750

[56] References Cited

U.S. PATENT DOCUMENTS

| | | | |
|---|---|---|---|
| 4,510,176 | 4/1985 | Cuthbert et al. | 427/82 |
| 4,732,785 | 3/1988 | Brewer | 427/240 |
| 5,168,021 | 12/1992 | Arai et al. | 430/22 |
| 5,328,871 | 7/1994 | Tanigawa et al. | 437/231 |
| 5,425,846 | 6/1995 | Koze et al. | 156/646 |
| 5,609,995 | 3/1997 | Akram et al. | 430/327 |
| 5,773,083 | 6/1998 | Fischer et al. | 427/240 |
| 5,779,928 | 7/1998 | Yamashita et al. | 216/92 |
| 5,783,097 | 7/1998 | Lo et al. | 216/41 |

OTHER PUBLICATIONS

"Novel edge bead process—by channeling UV light through cable to expose resist at edge of spinning wafer after post–exposure baking before development" Research Disclosure #331,028, Nov. 1991.

*Primary Examiner*—R. Bruce Breneman
*Assistant Examiner*—Anita Alanko
*Attorney, Agent, or Firm*—George O. Saile; Stephen B. Ackerman

[57] ABSTRACT

A method is described for selectively etching photoresist on a semiconductor substrate having one or more layers of a spin on glass, including an edge bead that was formed when the glass was originally applied. First the wafer is coated with a layer of unexposed, undeveloped negative photoresist. Then, while spinning the wafer, a vertical jet of photoresist EBR solvent is directed to a point just inside the edge so that photoresist gets removed from an annular area extending inwards from the perimeter. The edge bead is then removed using a liquid etchant and integrated circuit processing can now proceed, making use of the unexposed, undeveloped layer of photoresist in the usual way; that is, exposing it through a mask and then developing and baking it before using it as an etch mask. The method is general and may be used in other situations where selective removal of photoresist along the periphery is required and where the remaining resist is to be used for other purposes.

13 Claims, 3 Drawing Sheets

PROCESS FOR WAFER PERIPHERAL EDGE DEFECT REDUCTION

BACKGROUND OF THE INVENTION

(1) FIELD OF THE INVENTION

The invention relates to the general field of integrated circuits, more particularly to the improved use of spin on glass.

(2) DESCRIPTION OF THE PRIOR ART

It is common practice to apply, to the surface of an integrated circuit, a layer of a spin on glass (SOG). As the name implies, a spin on glass is applied to the surface of the integrated circuit in liquid form, most commonly by spin coating. After drying, this coating is heated in an oxidizing atmosphere as a result of which it is converted into a glassy layer. Since it was originally applied as a liquid, this layer will have a planar upper surface; that is, the integrated circuit will be planarized. Additional steps in the manufacture of the integrated circuit, such as etching, can now proceed.

One problem associated with this method of planarization is that, during the application of the SOG, a thickened region, or edge bead, tends to form near the periphery of the wafer. This is a consequence of the fact that the SOG is applied in droplet form at the axis of the spinning wafer and then spreads out because of centrifugal force. A "SOG hump" is induced as a result of the top and edge rinse (in isopropyl alcohol or similar solvent) that is applied during the SOG coating process.

The above-mentioned SOG edge bead is undesirable for several reasons: During subsequent processing steps, such as plasma etching where the wafer is held in place by a set of tight fitting claws, the edge bead tends to act as a source of dust. The edge bead introduces stress into the SOG layer which, in turn, leads to the propagation of defects into the semiconductor layers immediately beneath it. Last, but not least, the presence of the bead defeats one of the main purposes of SOG application, namely planarization.

For all of these reasons it is common practice to remove the edge bead as part of the total process. A straightforward, but relatively expensive, way of achieving this is to provide a photoresist mask that protects the center of the wafer and to then remove the edge bead by etching in the normal way, following which the resist mask is removed and processing proceeds as normal. In order to avoid this extra masking and etching step a number of novel schemes for the direct removal of edge beads have been described in the prior art. For example, Koze et al. (U.S. Pat. No. 5,425,846 June 1995) stack multiple wafers, each of which has a similar edge bead, one on top of another and then subject the stack to a plasma etch. Etching proceeds from the wafers' edges inward and is terminated once the etch front has passed the edge beads.

Cuthbert et al. (U.S. Pat. No. 4,510,176 April 1985) direct a jet of SOG solvent at the wafer's periphery while the wafer is spinning. Care is taken to ensure that debris resulting from the SOG removal does not contaminate the wafer.

The approach of Brewer (U.S. Pat. No. 4,732,785 March 1988) is similar to that of Cuthbert et al. but is modified in that multiple treatments (of solvent) are given to the edge bead while at the same time the speed of rotation is gradually reduced.

Tanigawa et al. (U.S. Pat. No. 5,328,871 July 1994) remove the edge bead after the SOG has been applied to the wafer but before it has been processed into a glass. Under these conditions it is easier to remove. This is done using a jet of solvent directed at the spinning wafer at a point just inside the wafer's periphery.

SUMMARY OF THE INVENTION

It has been an object of the present invention to provide a method for selectively etching material along the periphery of a circular substrate while at the same time providing a layer of unexposed photoresist that is available for other purposes.

Another object of the present invention has been to provide a method for the removal of an edge bead from a layer of spin on glass.

Yet another object has been to remove said edge bead with minimum interruption of an integrated circuit manufacturing process.

These objects have been achieved for a semiconductor substrate whose top layer consists of a spin on glass, including an edge bead that was formed when the glass was originally applied. First the wafer is coated with a layer of unexposed, undeveloped positive or negative photoresist. Then, while spinning the wafer, a vertical jet of photoresist EBR solvent is directed to a point just inside the edge so that photoresist gets removed from an annular area extending inwards from the perimeter. The edge bead is then removed using a liquid etchant and integrated circuit processing can now proceed, making use of the unexposed, undeveloped layer of photoresist in the normal way, that is exposing it through a mask and then developing and baking it and then using it as an etch mask.

DESCRIPTION OF THE PREFERRED EMBODIMENTS

The normal sequence of events when processing a negative photoresist is as follows:

a) photoresist in liquid form is applied to the surface of a wafer by means of spin coating;

b) the photoresist is allowed to dry and is then subjected to a soft bake—a mild heat treatment, typically at temperatures between about 100° and 150° C. for between about 1 and 3 minutes;

c) the photoresist is exposed to actinic radiation through a mask, those parts of the resist that receive the radiation becoming photopolymerized;

d) a developer is applied to the resist, thereby washing away all parts that were not exposed to the radiation;

e) the resist is subjected to a hard bake, typically at temperatures between about 100° and 150° C. for between about 1 and 3 minutes, converting it to an etch mask that is harder, tougher, and more etch resistant;

f) etching of the underlying surface proceeds, and g) when etching is complete the etch mask is removed.

As discussed earlier, a widely used method of removing edge beads in SOG layers is to protect the central part of the wafer, leaving only the edge bead uncovered, and to then remove, or reduce the size of, the bead through etching. This method involves going through all the steps listed above. In a manufacturing environment where every step in a process adds to the final cost of the product the effective elimination of one or more steps is an ongoing pursuit.

In the present invention, we provide a way to allow the sequence listed above to serve a dual purpose, namely removal of the edge bead as well its normal etching function. This is achieved by interrupting the sequence after step (b). At this point there is in place a solid layer of unexposed and undeveloped photoresist. We have found that such a layer is capable of acting as an etch barrier provided the etch conditions are not too violent (for example as a result of vigorous agitation of the etch bath).

Figure 1:
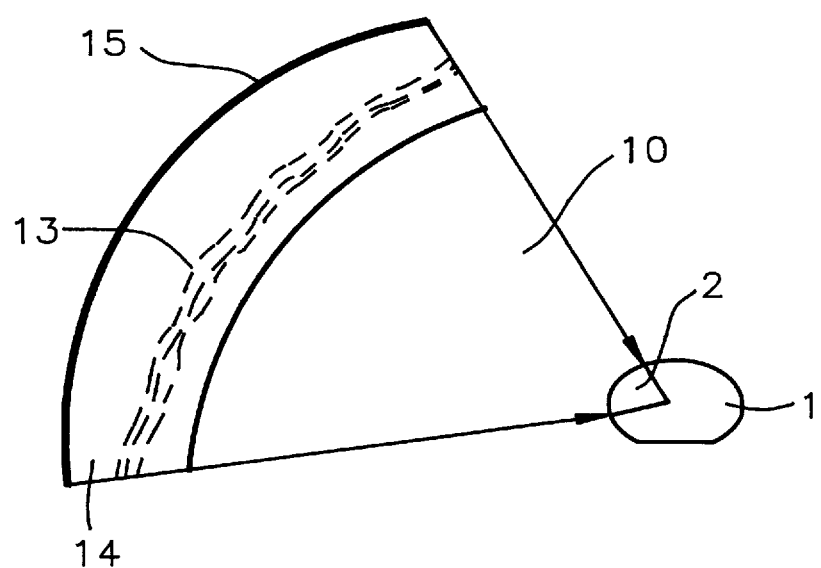
FIG. 1 is a planar view of a sector of an integrated circuit wafer showing the edge bead that is associated with the application of a layer of SOG.

Since the shape that we want the photoresist to assume is a simple circle slightly smaller than the full wafer, we can avoid exposing and globally developing it by confining the development process to an annular area near the wafer periphery. This area, which is just wide enough to uncover the edge bead while still covering all integrated circuits in their entirety, is illustrated in FIG. 1. Sector 2 of semiconductor wafer 1 is shown on the left in an enlarged view. Area 10 represents undeveloped and unexposed photoresist. It extends from the wafer center to just short of edge bead 13 which is located inside annular area 14 which extends all the way to the wafer periphery.

Figure 2:
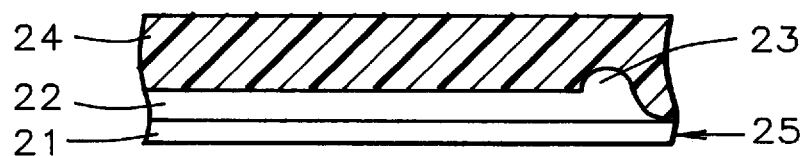
FIG. 2 is a cross-section showing a wafer, including an edge bead, that has been coated with photoresist.

Referring now to FIG. 2, we begin our description of the full process. Shown there is a schematic cross-section of part of semiconductor substrate or wafer 21 (which includes partly processed integrated circuits) that has been coated with SOG layer 22 which includes edge bead 23. Layer 22 has been coated with a layer of positive or negative photoresist 24 which covers the entire wafer, extending all the way to the periphery 25 of the wafer. The preferred method of application has been spin coating.

Figure 3:
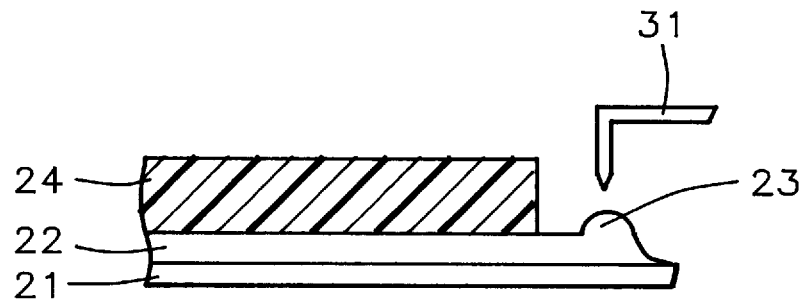
FIGS. 3 and 4 show how jets direct EBR solvent along the edge of a wafer, removing the resist in that area.

After layer 24 has been soft baked the wafer is mounted horizontally and spun on its vertical axis. A jet of photoresist EBR solvent (such as propylene glycol monoethyl ester acetate) is directed in a vertical direction at the wafer's edge, just inside the periphery. This results in the removal of an annular area that includes the edge bead (see FIG. 1). FIG. 3 is a cross-section of the wafer after the selective removal of photoresist from the periphery. Developer bearing jet 31 is positioned to direct EBR solvent in a vertical direction onto the surface of the spinning wafer, as shown. As can be seen, edge bead 21 has now been uncovered while the rest of the SOG remains covered.

Figure 4:
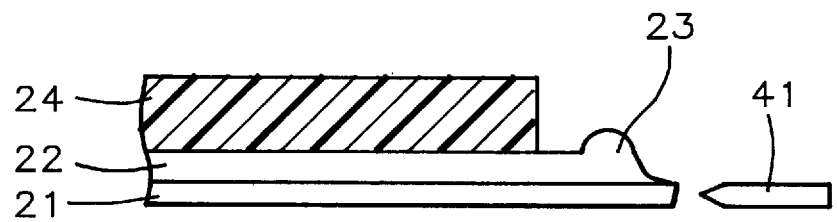
Figure 5:
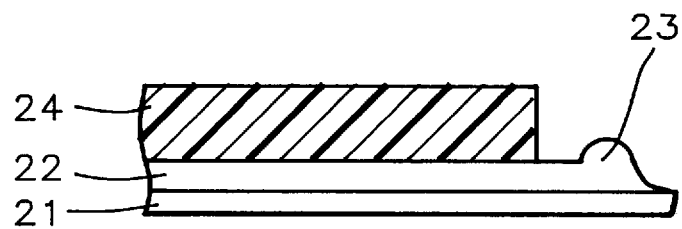
FIGS. 5 and 6 show how the edge bead may be removed by etching.

Since some of the photoresist may have overflowed and cover wafer edge 25, a horizontally mounted jet 41 (see FIG. 4) may also be used to remove photoresist that is not reached by developer dispensed by jet 31. At this point in the process the system has the appearance illustrated in FIG. 5. Edge bead 23 has been uncovered while the rest of the wafer, including the integrated circuits, remains covered.

Figure 6:
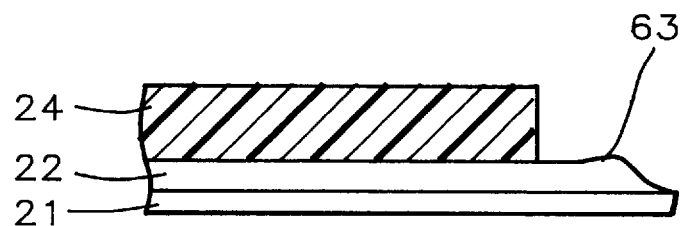

The next step in the process is to remove the edge bead by means of etching. Typically we have etched in a buffered oxide etch, such as a mixture of hydrofluoric acid and ammonium fluoride, for between about 1 and 5 minutes at a temperature between about 15° and 30° C. At this point the system has the appearance illustrated in FIG. 6. The edge bead has been largely removed leaving behind only a slight surface rise 63 where the bead had been.

Figure 7:
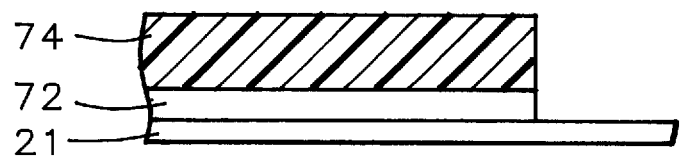
FIG. 7 shows the appearance of the wafer after further etching of the integrated circuit itself.

From this point on processing of the integrated circuit proceeds as normal. The photoresist is exposed to actinic radiation through a patterning mask and is then given its hard bake. Typically this involves heating for between about 1 and 3 minutes at a temperature between about 100° and 150° C. The system is then etched in the usual way to effect selective removal of the underlying SOG, giving the wafer the appearance shown in FIG. 7. Etch mask 74 covers patterned SOG layer 72, leaving the rest of the surface of wafer 21 free of SOG.

We note here that although the above description has been for the specific case of a SOG layer on a silicon wafer, the method is more general and could be applied to any substrate having a top layer that we wish to remove in an annular area around the periphery, while at the same time providing a layer of unexposed photoresist that is then available for further processing.

While the invention has been particularly shown and described with reference to the preferred embodiments thereof, it will be understood by those skilled in the art that various changes in form and details may be made without departing from the spirit and scope of the invention.

What is claimed is:

1. A method for selective etching comprising the sequential steps of:

providing a substrate having a circular perimeter and a vertical axis;

coating said substrate with a layer of unexposed, undeveloped photoresist;

while spinning the substrate about said axis, directing a vertical jet of photoresist EBR solvent inside said perimeter thereby removing photoresist from an annular area extending inwards from said perimeter and uncovering the underlying substrate;

etching the uncovered substrate;

through a mask, exposing the photoresist to actinic radiation; and then developing the photoresist.

2. The method of claim 1 wherein the substrate is a semiconductor wafer.

3. The method of claim 1 wherein the EBR solvent is propylene glycol monoethyl ester acetate.

4. The method of claim 1 wherein the photoresist is applied by means of spin coating.

5. The method of claim 1 wherein the step of coating with photoresist includes baking at between about 100° and 150° C. for between about 1 and 3 minutes.

6. The method of claim 1 wherein the step of directing a vertical jet of photoresist EBR solvent further comprises directing a horizontal jet of photoresist EBR solvent at a vertical edge of the circumference.

7. A method for removing an edge bead from a layer of spin on glass comprising the sequential steps of:

providing an integrated circuit wafer having a circular perimeter, a vertical axis and a top layer of spin on glass that includes an edge bead;

coating said wafer, including the edge bead, with a layer of unexposed, undeveloped photoresist;

while spinning the wafer about said axis, directing a vertical jet of photoresist EBR solvent inside said perimeter thereby removing photoresist from an annular area extending inwards from said perimeter and uncovering the edge bead;

removing the edge bead through an etching process;

through a patterning mask, exposing the photoresist to actinic radiation;

developing and then baking the photoresist thereby forming an etch mask on said layer of spin on glass; and etching the integrated circuit.

8. The method of claim 7 wherein the EBR solvent is propylene glycol monoethyl ester acetate.

9. The method of claim 7 wherein the photoresist is applied by means of spin coating.

10. The method of claim 7 wherein the step of coating with photoresist includes baking at between about 100° and 150° C. for between about 1 and 3 minutes.

11. The method of claim 7 wherein the step of etching the spin on glass further comprises etching in a solution of buffered hydrofluoric acid for between about 1 and 5 minutes at a temperature between about 15° and 30° C.

12. The method of claim 7 wherein the step of baking the photoresist, after developing, further comprises heating for between about 1 and 3 minutes at a temperature between about 100° and 150° C.

13. The method of claim 7 wherein said layer of spin on glass is applied for the purpose of planarizing the integrated circuit.

* * * * *